(12) United States Patent
Tso

(10) Patent No.: US 9,030,221 B2
(45) Date of Patent: May 12, 2015

(54) CIRCUIT STRUCTURE OF TEST-KEY AND TEST METHOD THEREOF

(75) Inventor: Ching-Yu Tso, Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 541 days.

(21) Appl. No.: 13/236,737

(22) Filed: Sep. 20, 2011

(65) Prior Publication Data
US 2013/0069682 A1    Mar. 21, 2013

(51) Int. Cl.
| | |
|---|---|
| G01R 1/067 | (2006.01) |
| H01L 21/66 | (2006.01) |
| G01R 31/27 | (2006.01) |
| G01R 31/28 | (2006.01) |
| G01R 31/3185 | (2006.01) |

(52) U.S. Cl.
CPC ............... *H01L 22/34* (2013.01); *G01R 31/27* (2013.01); *G01R 31/2831* (2013.01); *G01R 31/2884* (2013.01); *G01R 31/318547* (2013.01); *Y10S 345/904* (2013.01)

(58) Field of Classification Search
CPC .......... G09G 3/006; G09G 2300/0426
USPC ........... 324/760.01, 760.02, 762.01–762.03, 324/762.08, 762.09; 714/1; 716/4; 702/108; 345/904
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,233,448 A * | 8/1993 | Wu ................................. 349/40 |
| 5,406,447 A | 4/1995 | Miyazaki | |

(Continued)

OTHER PUBLICATIONS

Christopher Hess, Sharad Saxena, Hossein Karbasi, Senthil Subramanian Michele Quarantelli, Angelo Rossoni, Stefano Tonello, Sa Zhao and Dustin Slisher, "Device Array Scribe Characterization Vehicle Test Chip for Ultra Fast Product Wafer Variability Monitoring", vol. 20, Mar. 2007, Proceedings IEEE 2007 Int. Conference on Microelectronic Test Structures.

(Continued)

*Primary Examiner* — Huy Q Phan
*Assistant Examiner* — Thang Le
(74) *Attorney, Agent, or Firm* — WPAT, PC; Justin King

(57) ABSTRACT

A circuit structure of a test-key and a test method thereof are provided. The circuit structure comprises a plurality of transistors, a first conductive contact, a plurality of second conductive contacts and a plurality of third conductive contacts. The transistors are arranged in a matrix. The first conductive contact is electrically connected to one source/drain of each transistor in each column of the matrix. Each second conductive contact is electrically connected to the other source/drain of each transistor in a corresponding column of the matrix. Each third conductive contact is electrically connected to the gate of each transistor in a corresponding row of the matrix. In the method, a plurality of driving pulses are provided to the third conductive contacts in sequence, and a plurality of output signals are read from the second conductive contacts to perform an element-character analyzing operation when a row of the transistors is turned on.

7 Claims, 4 Drawing Sheets

(56) References Cited

U.S. PATENT DOCUMENTS

| | | | |
|---|---|---|---|
| 5,446,309 A | 8/1995 | Adachi | |
| 5,576,730 A * | 11/1996 | Shimada et al. | 345/98 |
| 5,583,359 A | 12/1996 | Ng | |
| 5,637,900 A | 6/1997 | Ker | |
| 5,760,456 A | 6/1998 | Grzegorek | |
| 5,808,330 A | 9/1998 | Rostoker | |
| 5,923,225 A | 7/1999 | De Los Santos | |
| 5,959,820 A | 9/1999 | Ker | |
| 6,008,102 A | 12/1999 | Alford | |
| 6,081,146 A | 6/2000 | Shiochi | |
| 6,172,378 B1 | 1/2001 | Hull | |
| 6,194,739 B1 | 2/2001 | Ivanov | |
| 6,246,271 B1 | 6/2001 | Takada | |
| 6,285,578 B1 | 9/2001 | Huang | |
| 6,291,872 B1 | 9/2001 | Wang | |
| 6,362,643 B1 * | 3/2002 | Kim | 324/760.02 |
| 6,370,372 B1 | 4/2002 | Molnar | |
| 6,407,412 B1 | 6/2002 | Iniewski | |
| 6,427,226 B1 | 7/2002 | Mallick | |
| 6,448,858 B1 | 9/2002 | Helms | |
| 6,452,442 B1 | 9/2002 | Laude | |
| 6,456,221 B2 | 9/2002 | Low | |
| 6,461,914 B1 | 10/2002 | Roberts | |
| 6,480,137 B2 | 11/2002 | Kulkarni | |
| 6,483,188 B1 | 11/2002 | Yue | |
| 6,486,765 B1 | 11/2002 | Katayanagi | |
| 6,509,805 B2 | 1/2003 | Ochiai | |
| 6,518,165 B1 | 2/2003 | Yoon | |
| 6,521,939 B1 | 2/2003 | Yeo | |
| 6,545,547 B2 | 4/2003 | Fridi | |
| 6,560,306 B1 | 5/2003 | Duffy | |
| 6,588,002 B1 | 7/2003 | Lampaert | |
| 6,593,838 B2 | 7/2003 | Yue | |
| 6,603,360 B2 | 8/2003 | Kim | |
| 6,608,363 B1 | 8/2003 | Fazelpour | |
| 6,611,223 B2 | 8/2003 | Low | |
| 6,625,077 B2 | 9/2003 | Chen | |
| 6,630,897 B2 | 10/2003 | Low | |
| 6,639,298 B2 | 10/2003 | Chaudhry | |
| 6,653,868 B2 | 11/2003 | Oodaira | |
| 6,668,358 B2 | 12/2003 | Friend | |
| 6,670,953 B1 * | 12/2003 | Ozawa | 345/211 |
| 6,700,771 B2 | 3/2004 | Bhattacharyya | |
| 6,720,608 B2 | 4/2004 | Lee | |
| 6,724,677 B1 | 4/2004 | Su | |
| 6,756,656 B2 | 6/2004 | Lowther | |
| 6,795,001 B2 | 9/2004 | Roza | |
| 6,796,017 B2 | 9/2004 | Harding | |
| 6,798,011 B2 | 9/2004 | Adan | |
| 6,810,242 B2 | 10/2004 | Molnar | |
| 6,822,282 B2 | 11/2004 | Randazzo | |
| 6,822,312 B2 | 11/2004 | Sowlati | |
| 6,833,756 B2 | 12/2004 | Ranganathan | |
| 6,841,847 B2 | 1/2005 | Sia | |
| 6,847,572 B2 | 1/2005 | Lee | |
| 6,853,272 B1 | 2/2005 | Hughes | |
| 6,876,056 B2 | 4/2005 | Tilmans | |
| 6,885,534 B2 | 4/2005 | Ker | |
| 6,891,532 B2 * | 5/2005 | Nara et al. | 345/204 |
| 6,901,126 B1 | 5/2005 | Gu | |
| 6,905,889 B2 | 6/2005 | Lowther | |
| 6,909,149 B2 | 6/2005 | Russ | |
| 6,927,664 B2 | 8/2005 | Nakatani | |
| 6,958,522 B2 | 10/2005 | Clevenger | |
| 7,009,252 B2 | 3/2006 | Lin | |
| 7,027,276 B2 | 4/2006 | Chen | |
| 7,071,022 B2 * | 7/2006 | Couillard et al. | 438/97 |
| 7,205,612 B2 | 4/2007 | Cai | |
| 7,212,025 B2 * | 5/2007 | Tomita | 324/760.02 |
| 7,262,069 B2 | 8/2007 | Chung | |
| 7,365,627 B2 | 4/2008 | Yen | |
| 7,368,761 B1 | 5/2008 | Lai | |
| 7,405,642 B1 | 7/2008 | Hsu | |
| 7,408,372 B2 | 8/2008 | Agarwal et al. | |
| 7,672,100 B2 | 3/2010 | Van Camp | |
| 2001/0048318 A1 * | 12/2001 | Matsueda | 324/770 |
| 2002/0017917 A1 * | 2/2002 | Taguchi | 324/770 |
| 2002/0019123 A1 | 2/2002 | Ma | |
| 2002/0036545 A1 | 3/2002 | Fridi | |
| 2002/0047838 A1 * | 4/2002 | Aoki et al. | 345/205 |
| 2002/0188920 A1 | 12/2002 | Lampaert | |
| 2003/0030464 A1 * | 2/2003 | Tomita | 324/770 |
| 2003/0076636 A1 | 4/2003 | Ker | |
| 2003/0127691 A1 | 7/2003 | Yue | |
| 2003/0183403 A1 | 10/2003 | Kluge | |
| 2005/0068112 A1 | 3/2005 | Glenn | |
| 2005/0068113 A1 | 3/2005 | Glenn | |
| 2005/0087787 A1 | 4/2005 | Ando | |
| 2005/0200377 A1 * | 9/2005 | Orii et al. | 324/770 |
| 2006/0006431 A1 | 1/2006 | Jean | |
| 2006/0108694 A1 | 5/2006 | Hung | |
| 2006/0109025 A1 * | 5/2006 | Tomita | 324/770 |
| 2006/0192752 A1 * | 8/2006 | Ando | 345/156 |
| 2006/0267102 A1 | 11/2006 | Cheng | |
| 2007/0102745 A1 | 5/2007 | Hsu | |
| 2007/0210416 A1 | 9/2007 | Hsu | |
| 2007/0234554 A1 | 10/2007 | Hung | |
| 2007/0246801 A1 | 10/2007 | Hung | |
| 2007/0249294 A1 | 10/2007 | Wu | |
| 2007/0296055 A1 | 12/2007 | Yen | |
| 2008/0094166 A1 | 4/2008 | Hsu | |
| 2008/0185679 A1 | 8/2008 | Hsu | |
| 2008/0189662 A1 | 8/2008 | Nandy | |
| 2008/0200132 A1 | 8/2008 | Hsu | |
| 2008/0299738 A1 | 12/2008 | Hsu | |
| 2008/0303623 A1 | 12/2008 | Hsu | |
| 2009/0029324 A1 | 1/2009 | Clark | |
| 2009/0201625 A1 | 8/2009 | Liao | |
| 2010/0225770 A1 * | 9/2010 | Morimoto et al. | 348/189 |
| 2010/0279484 A1 | 11/2010 | Wang | |

OTHER PUBLICATIONS

Christopher Hess et al, "Device Array Scribe Characterization Vehicle Test Chip for Ultra Fast Product Wafer Variability Monitoring", vol. 20, Mar. 2007.

* cited by examiner providing a plurality of driving pulses to the third conductive contact pads respectively according to a predetermined sequence, so as to turn on the transistors row-by-row, wherein the enabling periods of two adjacent driving pulses in time do not overlap ~S502 reading out a plurality of output signals from the second conductive contact pads when a row of the transistors is turned on, so as to perform an element-character analyzing operation accordingly ~S504

FIG. 5

CIRCUIT STRUCTURE OF TEST-KEY AND TEST METHOD THEREOF

FIELD OF THE INVENTION

The present invention relates to the chip test field, and more particularly to a circuit structure of a test-key and a test method thereof.

BACKGROUND OF THE INVENTION

The test-key is a test tool disposed on a chip-scribing line, and the test-key generally has a plurality of devices under test (DUT). The devices under test are all basic elements such as transistors, resistors and capacitors, so that a user can determine whether a manufacturing process is aberrant by testing the character of these basic elements.

However, the conventional test method for the test-key generally tests one device at every turn. Thus, if the amount of the devices in the test-key is large, it will influence the measuring speed.

SUMMARY OF THE INVENTION

The present invention relates to a circuit structure of a test-key, which has a high test speed for testing devices under test and does not limit an amount of the devices under test.

The present invention also relates to a test method of a test-key with the above circuit structure.

The present invention provides a circuit structure of a test-key. The circuit structure comprises a plurality of transistors, a first conductive contact pad, a plurality of second conductive contact pads and a plurality of third conductive contact pads. The transistors are arranged in a matrix. The first conductive contact pad is electrically coupled to a first source/drain terminal of each of the transistors in each column of the matrix. Each of the second conductive contact pads is electrically coupled to a second source/drain terminal of each of the transistors in a corresponding column of the matrix. Each of the third conductive contact pads being electrically coupled to a gate terminal of each of the transistors in a corresponding row of the matrix.

The present invention also provides a test method of a test-key. The circuit structure of the test-key comprises a plurality of transistors, a first conductive contact pad, a plurality of second conductive contact pads and a plurality of third conductive contact pads. The transistors are arranged in a matrix. The first conductive contact pad is electrically coupled to a first source/drain terminal of each of the transistors in each column of the matrix. Each of the second conductive contact pads is electrically coupled to a second source/drain terminal of each of the transistors in a corresponding column of the matrix, and each of the third conductive contact pads is electrically coupled to a gate terminal of each of the transistors in a corresponding row of the matrix. The test method comprises the following steps: providing a plurality of driving pulses to the third conductive contact pads respectively according to a predetermined sequence, so as to turn on the transistors row-by-row, wherein the enabling periods of two adjacent driving pulses in time do not overlap; and reading out a plurality of output signals from the second conductive contact pads when a row of the transistors is turned on, so as to perform an element-character analyzing operation accordingly.

In an exemplary embodiment of the present invention, the circuit structure of the test-key further comprises a plurality of passive components. Each of the passive components has two terminals. Each of the passive components is electrically coupled between the first source/drain terminal of a corresponding one of the transistors and the first conductive contact pad or between the second source/drain terminal of a corresponding one of the transistors and a corresponding one of the second conductive contact pads.

In an exemplary embodiment of the present invention, the circuit structure of the test-key further comprises a scan-pulse generating circuit. The scan-pulse generating circuit is electrically coupled to the third conductive contact pads to provide a plurality of driving pulses to the third conductive contact pads respectively according to a predetermined sequence, so as to turn on the transistors row-by-row. Wherein, the enabling periods of two adjacent driving pulses in time do not overlap.

In an exemplary embodiment of the present invention, the scan-pulse generating circuit comprises a clock generator and a plurality of shift registers. The clock generator is configured for generating a clock signal. The shift registers are connected in series. An output terminal of each of the shift registers is electrically coupled to a corresponding one of the third conductive contact pads. Each of the shift registers receives the clock signal for outputting a driving pulse, so as to use the driving pulse to turn on the transistors in a corresponding row corresponding to a third conductive contact pad which receives the driving pulse. Furthermore, the enabling periods of two driving pulses outputted from two adjacent shift registers do not overlap.

The present invention uses a plurality of transistors, a first conductive contact pad, a plurality of second conductive contact pads and a plurality of third conductive contact pads to form the test-key. When using the transistors as the devices under test, the present invention may input a test signal to the first conductive contact pad and turn on the transistors row-by-row according to a predetermined sequence, so as to read out the output signals of the transistors in each row from the second conductive contact pads and to perform an element-character analyzing operation related to the transistors. Then, the present invention determines whether a manufacturing process is aberrant according to the results of the element-character analyzing operation. When the circuit structure of the test-key is used to test a plurality of passive components (i.e., the passive components are used as the devices under test), and each of the passive components has two terminals, each of the passive components can be electrically coupled between the first source/drain terminal of a corresponding one of the transistors and the first conductive contact pad or between the second source/drain terminal of a corresponding one of the transistors and a corresponding one of the second conductive contact pads. Then, the present invention may turn on the transistors row-by-row according to a predetermined sequence to test the passive components.

Since the present invention can test the devices row-by-row, the test speed of the present invention is high. In addition, since the present invention does not use the coding and decoding mode to select the devices one-by-one, the present invention does not limit the amount of the device under test. In addition, the present invention further provides a circuit structure of a test-key which integrates with a scan-pulse generating circuit therein, so as to use the scan-pulse generating circuit to generate a plurality of driving pulses for driving the transistors of the test-key row-by-row. Therefore, the present invention can automatically and rapidly test the devices under test of the test-key.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5 is a flow chart of a test method of a test-key in accordance with an exemplary embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
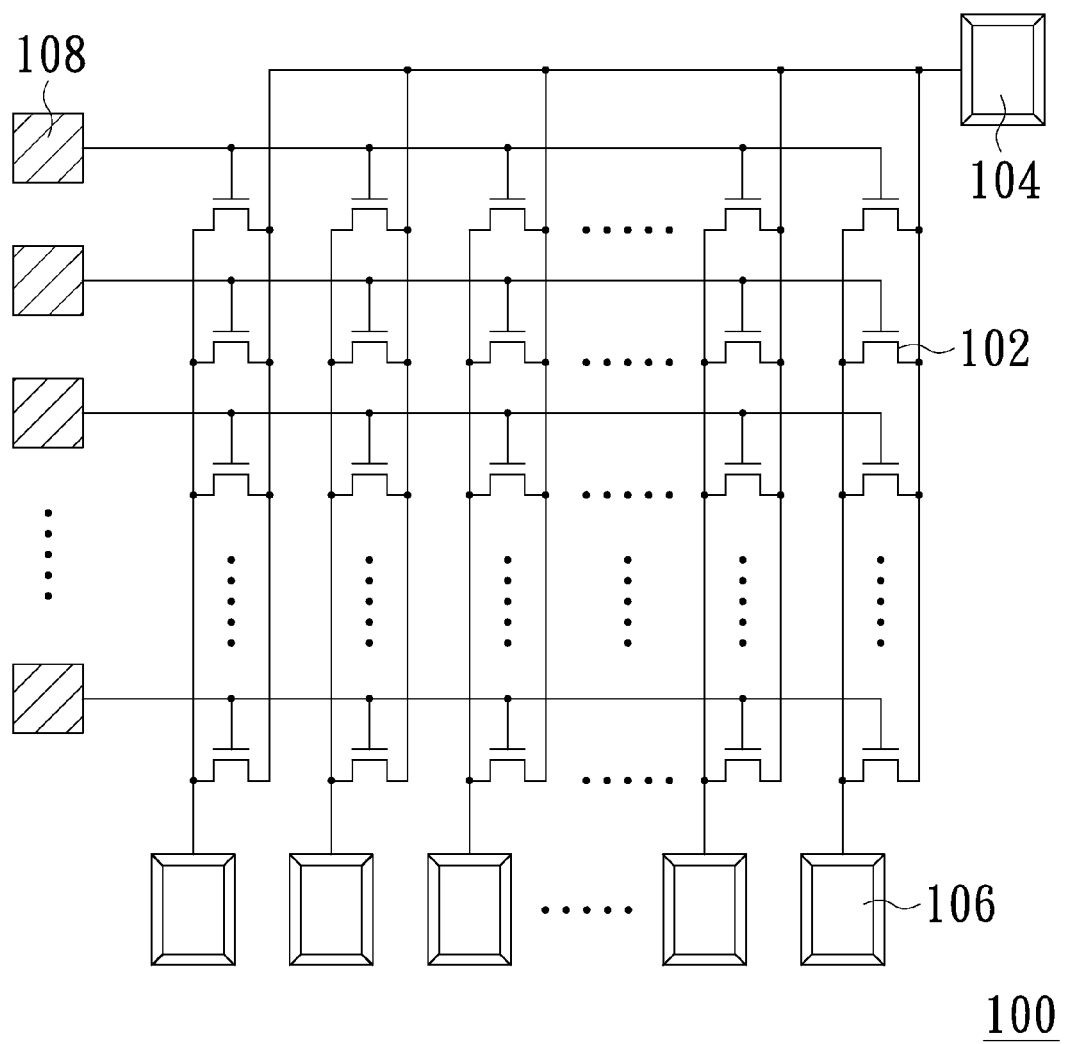
FIG. 1 is a view for showing a circuit structure of a test-key in accordance with an exemplary embodiment of the present invention.

FIG. 1 is a view for showing a circuit structure of a test-key in accordance with an exemplary embodiment of the present invention. Referring to FIG. 1, the circuit structure of the test-key 100 comprises a plurality of transistors (as marked by a label 102), a first conductive contact pad (as marked by a label 104), a plurality of second conductive contact pads (as marked by a label 106) and a plurality of third conductive contact pads (as marked by a label 108). The transistors 102 are arranged in a matrix, and each of the transistors 102 may be a metal-oxide semiconductor field-effect transistor (MOSFET). In addition, the first conductive contact pad 104 is electrically coupled a first source/drain terminal of each of the transistors 102 in each column of the matrix. Each of the second conductive contact pads 106 is electrically coupled to a second source/drain terminal of each of the transistors in a corresponding column of the matrix. Each of the third conductive contact pads 108 is electrically coupled to the gate terminal of each of the transistors 102 in a corresponding row of the matrix.

When the transistors 102 are all used as devices under test, the circuit structure of the test-key as shown in FIG. 1 allows a test signal to be inputted to the first conductive contact pad 104 and allows the transistors 102 to be turned on row-by-row according to a predetermined sequence (e.g., from top to bottom), so that the output signals of the transistors 102 in each row can be read from the second conductive contact pads 106. Thus, an element-character analyzing operation can be performed for the transistors 102 in each row to determine whether the manufacturing process is aberrant according to the results of the character-analyzing operation. The following will describe an embodiment of a circuit for driving the transistors 102.

Figure 2:
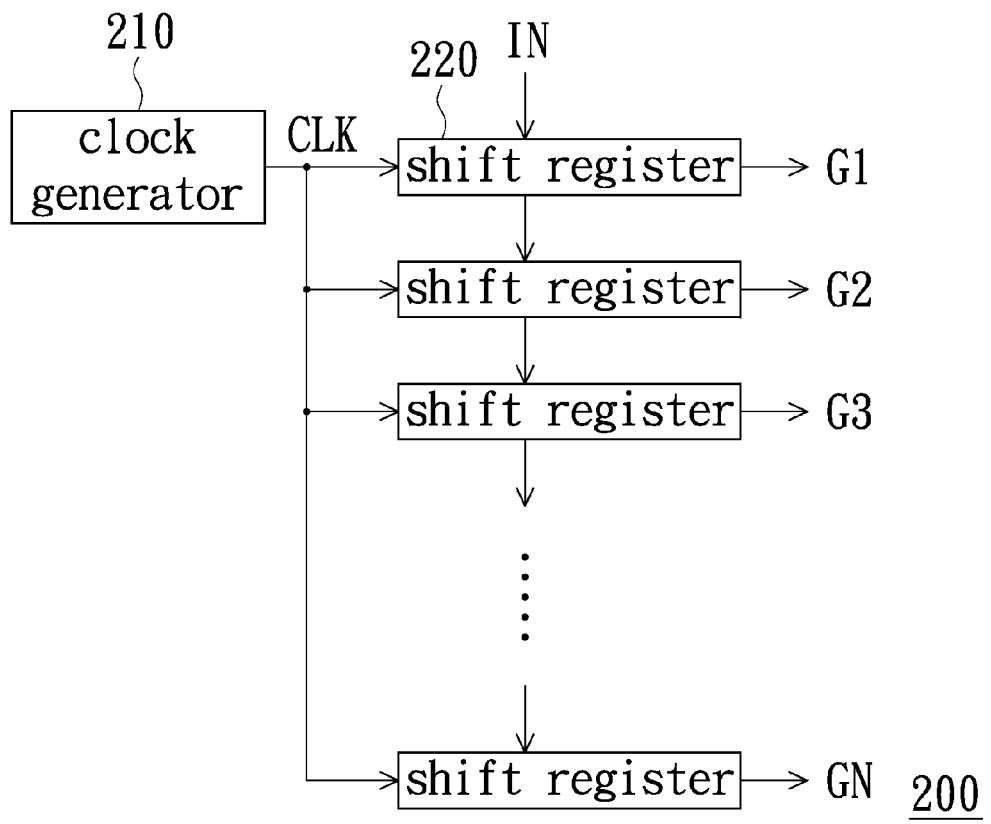
FIG. 2 is a schematic view of a scan-pulse generating circuit in accordance with an exemplary embodiment of the present invention.

FIG. 2 is a schematic view of a scan-pulse generating circuit in accordance with an exemplary embodiment of the present invention. Referring to FIG. 2, the scan-pulse generating circuit 200 comprises a clock generator 210 and a plurality of shift registers 220. The shift registers 220 are connected in series. In the exemplary, it can be seen that the amount of the shift registers 220 is the same as that of the third conductive contact pads. The clock generator 210 is configured for providing a clock signal CLK to each of the shift registers 220. In the shift registers 220, a shift register 220 at the first stage is configured for receiving a trigger pulse IN. Each of the shift registers 220 is configured for outputting a driving pulse (as marked by labels G1-GN), and the enabling periods of two driving pulses outputted from two adjacent shift registers 220 do not overlap. In addition, an output terminal of each of the shift registers 220 is electrically coupled to a corresponding one of the third conductive contact pads 108, so as to use the outputted driving pulses to turn on the transistors.

Figure 3:
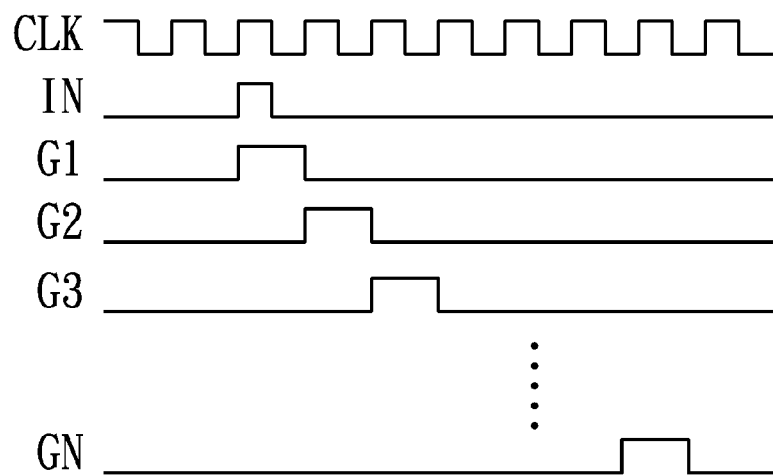
FIG. 3 is a time-sequence view of the clock pulse, the trigger pulse and the driving pulses as shown in FIG. 2.

FIG. 3 is a time-sequence view of the clock pulse, the trigger pulse and the driving pulses as shown in FIG. 2. In FIG. 3, the labels which are the same as the labels of FIG. 2 represent the same signals. From FIG. 3, it can be seen that the enabling periods of two adjacent driving pulses in time do not overlap, so as to avoid turning on the transistors 102 in adjacent two rows simultaneously.

Figure 4:
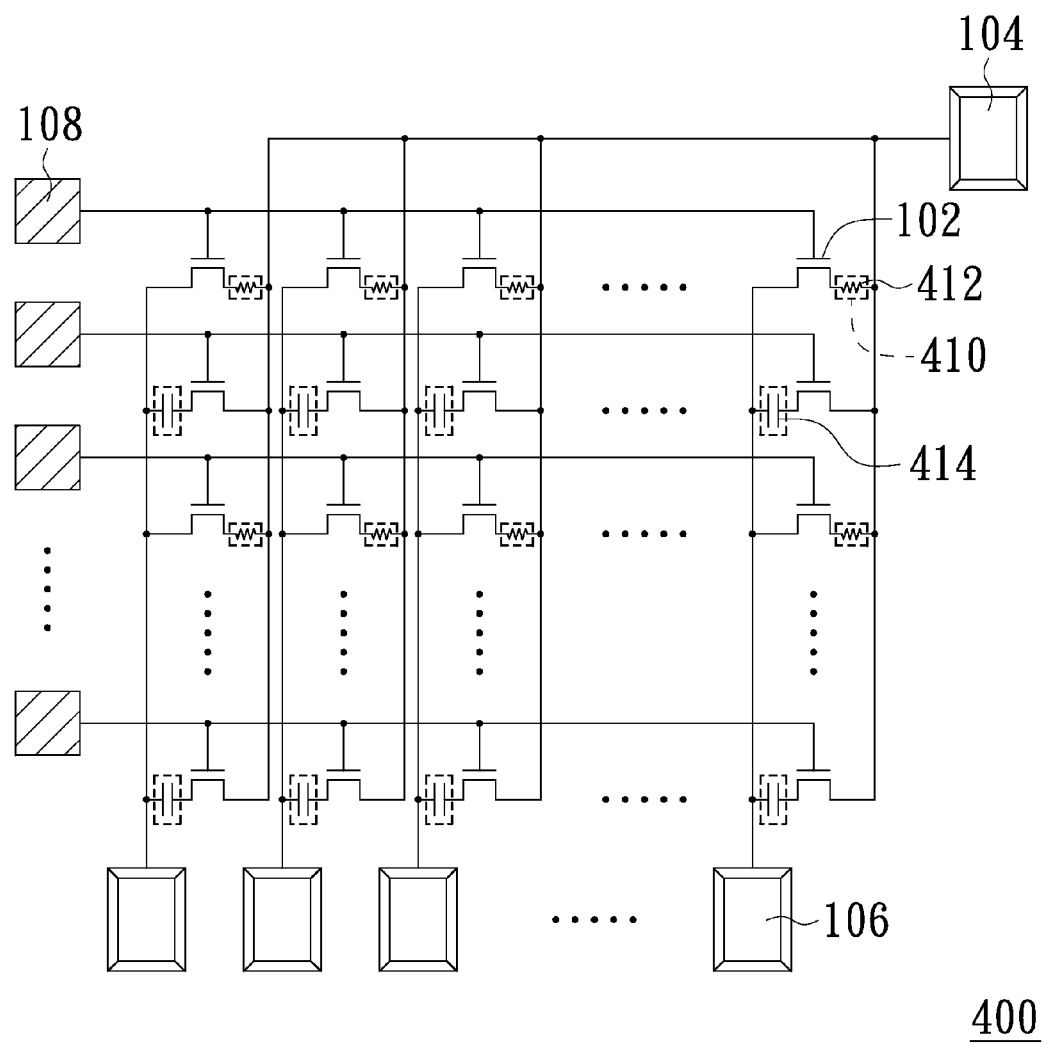
FIG. 4 is a view for showing a circuit structure of a test-key in accordance with another exemplary embodiment of the present invention.

In addition, when the circuit structure of the test-key 100 is used to test a plurality of passive components (i.e., the passive components are used as the devices under test), and each of the passive components has two terminals, the passive components which should be test can be added into the circuit structure of the test-key 100 as shown in FIG. 4 when manufacturing the test-key 100.

FIG. 4 is a view for showing a circuit structure of a test-key in accordance with another exemplary embodiment of the present invention. In FIG. 4, the labels which are the same as the labels of FIG. 1 represent the same objects. Referring to FIGS. 4 and 1, the circuit structure of the test-key 400 is similar to the circuit structure of the test-key 100 except that the circuit structure of the test-key 400 further includes a plurality of passive components (as marked by a label 410). Each of the passive components 410 has two terminals, and each of the passive components 410 is electrically coupled between the first source/drain terminal of a corresponding one of the transistors 102 and the first conductive contact pad 104 or between the second source/drain terminal of a corresponding one of the transistors 102 and a corresponding one of the second conductive contact pads 106. The passive components 410 may be resistors (as marked by a label 412) or capacitors (as marked by a label 414). Therefore, the present invention may turn on the transistors 102 row-by-row according to a predetermined sequence, so as to test the passive components 410.

It should be noted that the circuit structure of the test-key may integrate with the above scan-pulse generating circuit therein, so as to use the scan-pulse generating circuit to generate a plurality of driving pulses for driving the transistors of the test-key row-by-row. Therefore, the present invention can automatically and rapidly test the devices under test of the test-key.

From the above, it can conclude a test method for a test-key of the present invention for persons skilled in the art. FIG. 5 is a flow chart of a test method of a test-key in accordance with an exemplary embodiment of the present invention. The circuit structure of the test-key comprises a plurality of transistors, a first conductive contact pad, a plurality of second conductive contact pads and a plurality of third conductive contact pads. The transistors are arranged in a matrix. The first conductive contact pad is electrically coupled to a first source/drain terminal of each of the transistors in each column of the matrix. Each of the second conductive contact pads is electrically coupled to a second source/drain terminal of each of the transistors in a corresponding column. Each of the third conductive contact pads is electrically coupled to the gate terminal of each of the transistors in a corresponding row. The test method comprises the following steps: providing a plurality of driving pulses to the third conductive contact pads respectively according to a predetermined sequence, so as to turn on the transistors row-by-row, wherein the enabling periods of two adjacent driving pulses in time do not overlap (as shown in a step S502); and reading out a plurality of output signals from the second conductive contact pads when a row of the transistors is turned on, so as to perform an element-character analyzing operation accordingly.

In summary, the present invention uses a plurality of transistors, a first conductive contact pad, a plurality of second conductive contact pads and a plurality of third conductive contact pads to form the test-key. When using the transistors as the devices under test, the present invention may input a test signal to the first conductive contact pad and turn on the transistors row-by-row according to a predetermined sequence, so as to read out the output signals of the transistors in each row from the second conductive contact pads and to perform an element-character analyzing operation related to the transistors. Then, the present invention determines whether a manufacturing process is aberrant according to the results of the element-character analyzing operation. When the circuit structure of the test-key is used to test a plurality of passive components (i.e., the passive components are used as the devices under test), and each of the passive components has two terminals, each of the passive components can be electrically coupled between the first source/drain terminal of a corresponding one of the transistors and the first conductive contact pad or between the second source/drain terminal of a corresponding one of the transistors and a corresponding one of the second conductive contact pads. Then, the present invention may turn on the transistor row-by-row according to a predetermined sequence to test the passive components.

Since the present invention can test the devices row-by-row, the test speed of the present invention is high. In addition, since the present invention does not use the coding and decoding mode to select the devices one-by-one, the present invention does not limit the amount of the device under test. In addition, the present invention further provides a circuit structure of a test-key which integrates with a scan-pulse generating circuit therein, so as to use the scan-pulse generating circuit to generate a plurality of driving pulses for driving the transistors of the test-key row-by-row. Therefore, the present invention can automatically and rapidly test the devices under test of the test-key.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A test method of a test-key, the circuit structure of the test-key comprising a plurality of transistors, a first conductive contact pad, a plurality of second conductive contact pads and a plurality of third conductive contact pads, the transistors being arranged in a matrix, the first conductive contact pad being electrically coupled to a first source/drain terminal of each of the transistors in each column of the matrix, each of the second conductive contact pads being electrically coupled to a second source/drain terminal of each of the transistors in a corresponding column of the matrix, and each of the third conductive contact pads being electrically coupled to a gate terminal of each of the transistors in a corresponding row of the matrix, the test method comprising:
  providing a plurality of driving pulses to the third conductive contact pads respectively according to a predetermined sequence, so as to turn on the transistors row-by-row, wherein the enabling periods of two adjacent driving pulses in time do not overlap;
  providing a test signal to the first conductive contact pad during a test; and
  reading out a plurality of output signals as test results from the second conductive contact pads when a row of the transistors is turned on, so as to perform an element-character analyzing operation accordingly.

2. The test method of the test-key according to claim 1, wherein the circuit structure of the test-key further comprises a plurality of passive components, each of the passive components has two terminals, and each of the passive components is electrically coupled to the first source/drain terminal of a corresponding one of the transistors and the first conductive contact pad or between the second source/drain terminal of a corresponding one of the transistors and a corresponding one of the second conductive contact pads.

3. The test method of the test-key according to claim 2, wherein the passive components comprises at least one resistor.

4. The test method of the test-key according to claim 2, wherein the passive components comprises at least one capacitor.

5. The test method of the test-key according to claim 1, wherein each of the transistors is a metal-oxide transistor field-effect transistor.

6. The test method of the test-key according to claim 1, wherein the driving pulses are generated by a scan-pulse generating circuit, the scan-pulse generating circuit is electrically coupled to the third conductive contact pads, so as to provide the driving pulses to the third conductive contact pads respectively according to the predetermined sequence.

7. The test method of the test-key according to claim 6, wherein the scan-pulse generating circuit comprises:
  a clock generator configured, for generating a clock signal; and
  a plurality of shift registers, the shift registers being connected in series, an output terminal of each of the shift registers being electrically coupled to a corresponding one of the third conductive contact pads, each of the shift registers receiving the clock signal for outputting a driving pulse, so as to use the driving pulse to turn on the transistors in a corresponding row corresponding to a third conductive contact pad which receives the driving pulse, and the enabling periods of two driving pulses outputted from two adjacent shift registers do not overlap.

* * * * *